(12) United States Patent
Rohrbach et al.

(10) Patent No.: US 6,610,395 B2
(45) Date of Patent: *Aug. 26, 2003

(54) BREATHABLE ELECTROMAGNETIC SHIELDING MATERIAL

(75) Inventors: Ronald P. Rohrbach, Flemington, NJ (US); David Nathasingh, Higley, AZ (US); Kwok-Wai Lem, Randolph, NJ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/878,360

(22) Filed: Jun. 11, 2001

(65) Prior Publication Data

US 2002/0187330 A1 Dec. 12, 2002

(51) Int. Cl.[7] .......................... D04H 1/00; D04H 13/00; D04H 3/00; D04H 5/00
(52) U.S. Cl. .................... 428/292.1; 428/364; 428/372; 428/373; 428/396; 428/397; 428/398; 428/408
(58) Field of Search ................................ 428/397, 373, 428/372, 292.1, 364, 408, 304.4, 306.6, 398, 396

(56) References Cited

U.S. PATENT DOCUMENTS

| | | | |
|---|---|---|---|
| 4,975,317 A | * 12/1990 | Kuhn et al. ................ | 428/353 |
| 5,057,368 A | * 10/1991 | Largman et al. ............ | 428/397 |
| 5,069,970 A | 12/1991 | Largman et al. ............ | 428/373 |
| 5,130,342 A | * 7/1992 | McAllister et al. ........... | 521/61 |
| 5,225,110 A | * 7/1993 | Kathirgamanathan ....... | 252/521 |
| 5,310,784 A | 5/1994 | Ide et al. .................... | 524/876 |
| 5,432,237 A | * 7/1995 | Otsuka et al. .............. | 525/284 |
| 5,744,236 A | * 4/1998 | Rohrbach et al. ........... | 428/372 |
| 5,763,103 A | * 6/1998 | McCullough ............... | 428/394 |
| 5,858,530 A | * 1/1999 | McCullough, Jr. .......... | 428/367 |
| 5,989,720 A | 11/1999 | Taniyama ................... | 428/450 |
| 6,048,614 A | 4/2000 | Rohrbach et al. ........... | 428/372 |
| 6,054,647 A | 4/2000 | Ridener ................ | 174/35 MS |
| 6,117,802 A | * 9/2000 | Rohrbach et al. ........... | 442/372 |
| 6,207,266 B1 | * 3/2001 | Kanbara et al. ............ | 428/323 |

FOREIGN PATENT DOCUMENTS

WO     WO 94/04014     4/1994

* cited by examiner

Primary Examiner—Cynthia H. Kelly
Assistant Examiner—Camie S Thompson
(74) Attorney, Agent, or Firm—William J. Zak, Jr.

(57) ABSTRACT

The formation of articles using a breathable, electromagnetic shielding material. More particularly, a material and process for the formation of articles capable of shielding electromagnetic waves while allowing the release of thermal energy. Electromagnetic shielding powder particles are infused into cavities of multilobal polymeric fibers and between the fibers forming a flexible, breathable electromagnetic shielding material suitable for forming shaped articles.

28 Claims, 4 Drawing Sheets

BREATHABLE ELECTROMAGNETIC SHIELDING MATERIAL

BACKGROUND OF THE INVENTION

1. Field of the Invention

The invention relates to the formation of articles using a breathable, electromagnetic shielding material. More particularly, the invention pertains to a material and process for the formation of articles capable of shielding electromagnetic waves while allowing the release of thermal energy.

2. Description of the Related Art

Electromagnetic radiation is formed from a combination of electric and magnetic fields generated by the movement of electrons through conductors. Certain electronic devices, such as radios or televisions, may utilize electromagnetic waves by intercepting transmitted signals. It is also well known that the performance of some electronic devices, or devices having electronic components can be negatively affected by the influence of electromagnetic wave radiation surrounding such devices. For example, electromagnetic waves may affect the operation of computer chips, sensors or various electronic detectors.

To combat this problem, it has been known in the art to develop structures or materials that are capable of shielding electromagnetic waves penetrating certain devices. For example, U.S. Pat. No. 6,054,647 teaches a nickel coated, woven grid material for incorporation with a molded housing to provide electromagnetic and radio frequency shielding. U.S. Pat. No. 5,310,784 teaches a composite carbon-resin reaction compound prepared by mixing a polymerizable resin with a carbon powder and polymerizing the mixture. The composite is capable of being readily formed into any configuration of a device housing. U.S. Pat. No. 5,989,720 teaches an electromagnetic wave shield material composition comprising a mixture of silicone resin, baked ceramics material and a mixture of an aluminum powder and/or stainless metal powder.

While these known structures or materials may be useful for preventing the penetration of electromagnetic waves into an electronic device, they also have the adverse effect of preventing heat generated by such electronic devices from being released. It is well known that along with being negatively influenced by electromagnetic radiation, the performance of electronic devices may be affected by prolonged heat generated during their use, such as by permanently damaging parts within the device or causing the device to malfunction. In addition, the buildup of heat within the device may also reduce the lifetime of the electronic device. It is therefore desirable to have a material for forming electronic devices or electronic components for electronic devices that allows for heat to be released from the device as a cooling mechanism, while also blocking the entrance of harmful electromagnetic radiation. The present invention provides an alternative to these techniques above.

The present invention provides an electromagnetic shielding material comprising an arrangement of thermoplastic polymeric fibers infused with particles of an electromagnetic shielding powder. The polymeric fibers used herein are multilobal fibers disclosed in U.S. Pat. Nos. 5,057,368 and 5,744,236. The fibers are extruded and either woven together or arranged into a non-woven structure, and the powder particles are physically deposited within cavities formed by the fiber lobes and between fibers, forming a flexible shielding material. The flexible material may then be cut or formed into a structure of generally any shape or form and used as a housing for an electronic device. The material is breathable, in that it allows for the dissipation of non-linear thermal energy generated by a device, while preventing linear electromagnetic waves from entering the device.

SUMMARY OF THE INVENTION

The invention provides a process for forming a flexible, breathable electromagnetic shielding material for forming electromagnetic shielding articles comprising:

(a) forming a molten thermoplastic polymer mixture comprising one or more polymers;

(b) melt spinning said polymer mixture to form a plurality of multilobal fibers, said fibers comprising a central core having a plurality of T-shaped lobes projecting therefrom, each of said T-shaped lobes having a leg and a cap, said lobes defining a longitudinally extending internal cavity between two adjacent legs that extends the entire length of the fiber;

(c) arranging together said plurality of multilobal fibers into a sheet, the sheet having at least one surface; and (d) applying electromagnetic shielding powder particles to at least one surface of said sheet to infuse said electromagnetic shielding powder particles between said multilobal fibers and into each cavity, said powder particles being of such a size, shape and makeup that they are securely retained within each cavity.

The invention also provides a flexible, breathable electromagnetic shielding material for forming electromagnetic shielding articles comprising:

(a) a plurality of polymeric multilobal fibers arranged together into a sheet having at least one surface, said fibers comprising a central core having a plurality of T-shaped lobes projecting therefrom, each of said T-shaped lobes having a leg and a cap, said lobes defining a longitudinally extending internal cavity between two adjacent legs that extends the entire length of the fiber; and (b) electromagnetic shielding powder particles infused between said arranged fibers and in said cavities, said powder particles being of such a size, shape and makeup that they are securely retained within each cavity.

DETAILED DESCRIPTION OF THE PREFERRED EMBODIMENTS

Figure 1:
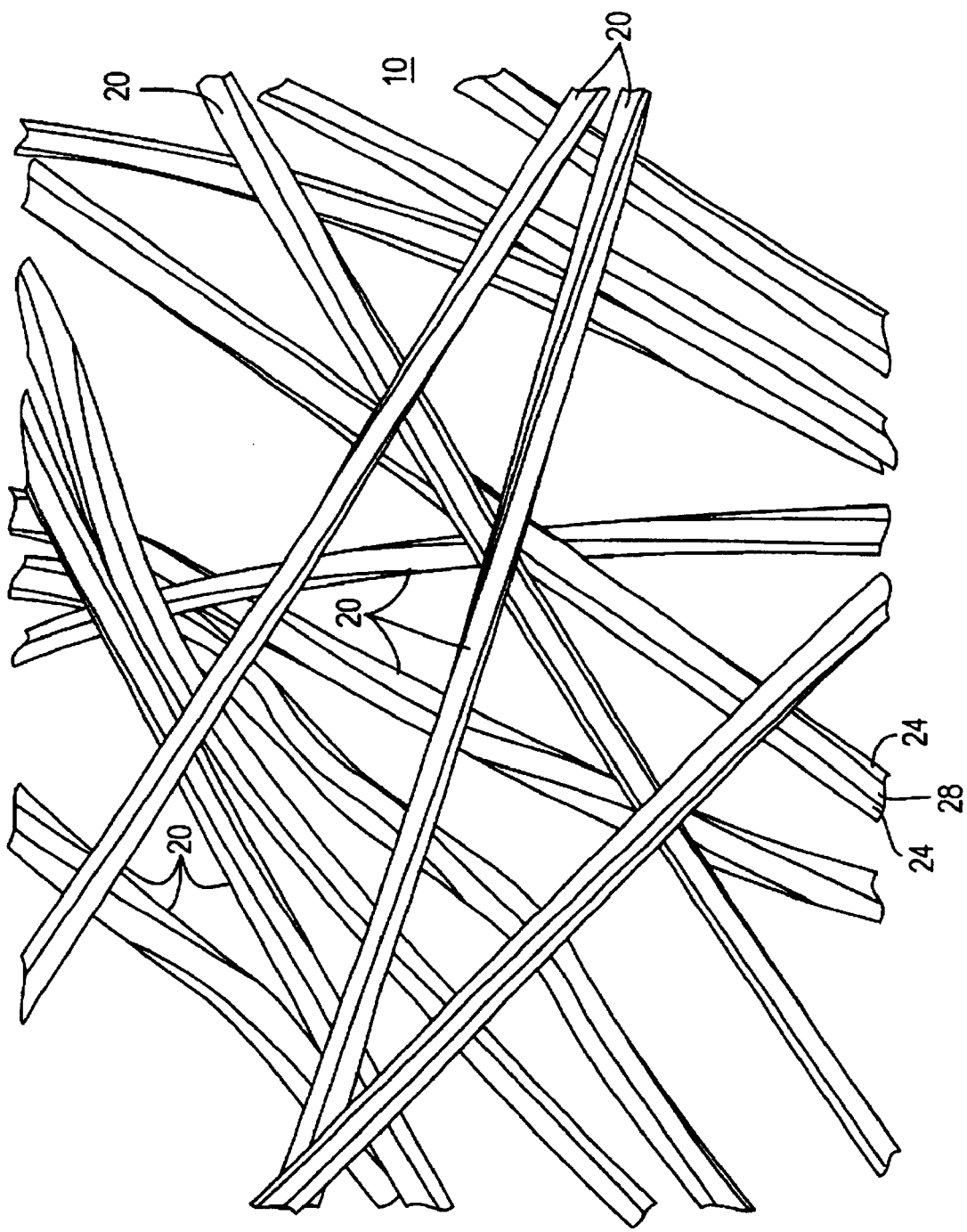
FIG. 1 shows a non-woven arrangement of a plurality of multilobal fibers.

The invention broadly provides a flexible, breathable electromagnetic shielding material for forming electromagnetic shielding articles and a process for forming the material. The first element of the material comprises an arrangement of a plurality of flexible, multilobal polymeric fibers. As shown in FIG. 1, the fibers are arranged into a sheet 10 of flexible material that may be either woven or non-woven. FIG. 1 illustrates an example of a non-woven sheet 10 of the invention.

Referring to FIG. 1, fibers 20 are arranged in random order to form the sheet 10 of material. The fibers 20 are comprised of a thermoplastic polymer capable of being spun into a fiber, including polyamides, polyesters and polyolefins and blends thereof. The polymers are formed into a polymer melt and then extruded and spun into fibers having the desired shape and form. Suitable polyamides non-exclusively include polyamide homopolymers, polyamide copolymers or a blend of polyamide homopolymers and copolymers. Preferred polyamides include, for example, the copolyamide of 30% hexamethylene diammonium isophthalate and 70% hexamethylene diammonium adipate, the copolyamide of up to 30% bis-(P-amidocyclohexyl) methylene, and terephthalic acid and caprolactan, poly (hexamethyleneadipamide) (nylon 66), poly(4-aminobutyric acid) (nylon 4), poly(7-aminoheptanoic acid) (nylon 7), poly(8-aminooctanoic acid) (nylon 8), poly(6-aminohexanoic acid) (nylon 6), poly(hexamethylene sebacamide) (nylon 6,10), poly(hapta-methylene pimelamide) (nylon 7,7), poly(octamethylene suberamide) (nylon 8,8), poly(hexamethylene sebacamide) (nylon 6,10), poly(nonamethylene azelamide) (nylon 9,9), poly (decamethylene azelamide) (nylon 10,9), poly (decamethylene sebacamide (nylon 10,10). poly[bis(4-amino-cyclohexyl)methane-1,10-decanedicarboxamide] [(Oiana) (trans)], poly(m-xylene adipamide), poly(p-xylene sebacamide), poly(2,2,2-trimethylhexamethylene pimelamide), poly(piperazine sebacamide), poly(meta-phenylene isophthalamide) (Nomex), poly(p-phenylene terephthalamide) (Kevlar), poly(11-amino-undecanoic acid) (nylon 11) poly(12-aminododecanoic acid) (nylon 12), poly-hexamethylene isophthalamide, polyhexamethylene terephthalamide, poly(9-aminononanoic acid) (nylon 9) polycaproamide, or combinations thereof. The most preferred polyamide is polycaprolactam which is commercially available from Honeywell International Inc., under the tradename CAPRON® Nylon.

Also suitable are a wide variety of polyesters, including homo-polyesters or co-polyesters or blends thereof. Polyesters are normally prepared by the condensation of an organic dicarboxylic acid and an organic diol. Such dicarboxylic acids and organic diols useful for forming the preferred polyesters are described in U.S. Pat. No. 5,069,970 which is incorporated herein by reference. Preferred polyesters include those which are derived from the condensation of aromatic, cycloaliphatic, and aliphatic diols with aliphatic, aromatic and cycloaliphatic dicarboxylic acids, and may be cycloaliphatic, aliphatic or aromatic polyesters. Suitable cycloaliphatic, aliphatic and aromatic polyesters include poly(ethylene terephthalate), poly (cyclohexylenedimethylene, terephthalate, poly(lactide), poly(ethylene azelate), poly(butylene terephthalate, poly [ethylene(2,7-naphthalate)], poly(glycolic acid), poly (ethylene succinate), poly(ethylene adipate), poly(ethylene sebacate), poly(ethylene sebacate), poly(decamethylene adipate), poly(decamethylene sebacate), poly(α,α-dimethylpropiolactone), poly(para-hydroxybenzoate) (akono), poy(ethyene oxybenzoate) (A-tell), poly(ethylene isophthalate), poly(tetramethylene terephthalate, poly (hexamethylene terephthalate), poly(decamethylene terephthalate), poly(1,4-cyclohexane dimethylene terephthalate) (trans), poly(ethylene 1,5-naphthalate), poly (ethylene 2,6-naphthalate), poly(1,4-cyclohexylidene dim-ethylene terephthalate) (Kodel) (cis), and poly(1,4-cyclohexylidene dimethylene terephthalate (Kodel) (trans).

Also preferred are polyester compounds prepared from the condensation of a diol and an aromatic dicarboxylic acid are preferred. Illustrative of such useful aromatic carboxylic acids are terephthalic acid, isophthalic acid and an orthophthalic acid, 1,3-, 1,4-, 2,6-or 2,7-napthalenedicarboxylic acid, 4,4'-diphenyl-dicarboxylic acid, 4,4'-diphenysulphone-dicarboxylic acid, 1,1,3-trimethyl-5-carboxy-(p-carboxyphenyl)-indane, diphenyl ether 4,4'-dicarboxylic acid, bis-p(carboxyphenyl)methane and the like. Of these, aromatic dicarboxylic acids based on a bezene ring such as terephthalic acid, isophthalic acid and orthophthalic acid are preferred. Of these, terephthalic acid is the most preferred. Most preferably, a polyester included in the polymer melt comprises poly(ethylene terephthalate), poly(butylene terephthalate) and/or poly(1,4-cyclohexane dimethylene terephthalate). Of these, poly(ethylene terephthalate) is most preferred.

Also useful are polyvinyl chloride, polyvinylene fluoride, polyacrylamide, polyacrylonitrile, polyvinyl pyridine, polyvinyl acetate, polyacrylic acid, polyvinyl pyrrolidine, polyvinyl methyl ether, polyvinyl formal, poly (P-vinyl phenol), polystyrene, polyethylene, polypropylene, poly(1-octadecene), polyisobutylene, poly(1-pentene), poly(2-methylstyrene), poly(4-methylstyrene), poly(1-hexene), poly(5-methyl-1-hexene), poly(4-methylpentene), poly(1-butene), poly(3-methyl-1-butene), poly(3-phenyl-1-propene), polybutylene, poly(methyl pentene-1), poly(1-hexene), poly(5-methyl-1-hexene), poly(1-octadecene), poly(vinyl cyclopentane), poly(vinylcyclohexane), poly(α-vinylnaphthalene), and the like.

Suitable polyolefins useful in the practice of the invention are those which are well known and include those of the formula:

$$R_1R_2C{=}CH_2$$

in which $R_1$ and $R_2$ are the same or different and are hydrogen or substituted or unsubstituted alkylphenyl, phenylalkyl, phenyl, or alkyl. Useful polyolefins include polystyrene, polyethylene, polypropylene, polyl(1-octadecene), polyisobutylene, poly(1-pentene), poly(2-methylstyrene), poly(4-methylstyrene), poly(1-hexene), poly(5-methyl-1-hexene), poly(4-methylpentene), poly(1-butene), poly(3-methyl-1-butene), poly(3-phenyl-1-propene), polybutylene, poly(methyl pentene-1), poly(1-hexene), poly(5-methyl-1-hexene), poly(1-octene), poly(1-octadecene), poly(vinyl cyclopentane), poly (vinylcyclohexane), poly(a-vinylnaphthalene), and the like.

Preferred polyolefins are those of the above formula in which $R_1$ and $R_2$ are hydrogen or alkyl having from 1 to about 12 carbon atoms such as polyethylene, polypropylene, polyisobutylene, poly(4-methyl-1-pentene), poly(1-butene), poly(1-pentene), poly(3-methyl-1-butene), poly(1-hexene), poly(5-methyl-1-hexene), poly(1-octene), and the like. More preferred are polyolefins in which $R_1$ is hydrogen and $R_2$ is hydrogen or alkyl having from 1 to about 8 carbon atoms, and most preferred are those embodiments in which $R_1$ is hydrogen and $R_2$ is hydrogen or alkyl having from 1 to about 6 carbon atoms, such as polyethylene, polypropylene, poly(4-methyl-1-pentene), and polyisobutylene, with polypropylene being the most preferred polyolefin.

In one preferred embodiment of the invention, the polymer used is a blend of one or more polyesters preferably poly(ethylene terephthalate), poly(butylene terephthalate), or poly(1,4-cyclohexane dimethylene terephthalate) and one or more polyolefins preferably polyethylene, polypropylene, poly(4-methyl-1-pentene) or polyisobutylene. The relative amounts of polyolefins and polyesters in the blend may vary widely. Preferably, the amount of polyolefin in the blend is from about 0.5 to about 25 percent by weight and the amount of polyester is from about 75 to about 95.5 percent by weight, based on the total weight of the fiber. Preferably, the amount of melt spinnable polyolefins comprises from about 1 to about 15 weight percent, and the amount of polyester is from about 98 to about 85 weight percent based on the total weight of the fiber. More preferably, the amount of melt spinnable polyolefins in the fiber is from about 2 to about 10 weight percent and the amount of polyester is from about 98 to about 90 weight percent based on the total weight of the fiber. Most preferably, the amount of melt spinnable polyolefins is from about 3 to about 8.5 percent by weight and the amount of polyester is from about 97 to about 91.5 weight percent based on the total weight of the fiber.

It is also preferred that the polymer used be a blend of nylon homopolymers and/or nylon copolymers. Preferred blends include a blend of nylon 6, nylon 66, or a blend of nylon 6, nylon 66 and nylon 6/12.

Various other optional ingredients, which are normally included in fibers formed from thermoplastic polymers may be added to the mixture at an appropriate time during the conduct of the process. Such optional components include fillers, plasticizers, colorants, mold release agents, antioxidants, ultra violet light stabilizers, lubricants, anti-static agents, fire retardants, and the like. These optional components are well known to those of skill in the art. For further description and other useful polyesters within the scope of the invention, see U.S. Pat. No. 5,057,368 which is incorporated herein by reference.

The polymers used in the practice of this invention are polymers having a molecular weight sufficiently high to allow spinning of the polymer into fiber. In general, the number average molecular weight (M) of the polymers is at least about 1000. Preferably, the number average molecular weight of the polymers is from about 1000 to about 1,000,000 and more preferably from about 10,000 to about 200,000. Most preferably, the number average molecular weight of the polymers is from about 20,000 to about 100,000. For more detail regarding the properties of the polymers, see U.S. Pat. No. 5,057,368.

The components of the thermoplastic polymer melt are heated together, using techniques well known in the art, to a temperature which is equal to or greater than the melting point of the highest melting polymer component of the mixture and are blended together to form a molten polymer blend. Alternately, the polymer melt may be formed by melting one polymer and dispersing the other polymer in the melted polymer at a temperature above its melting point.

Figure 2:
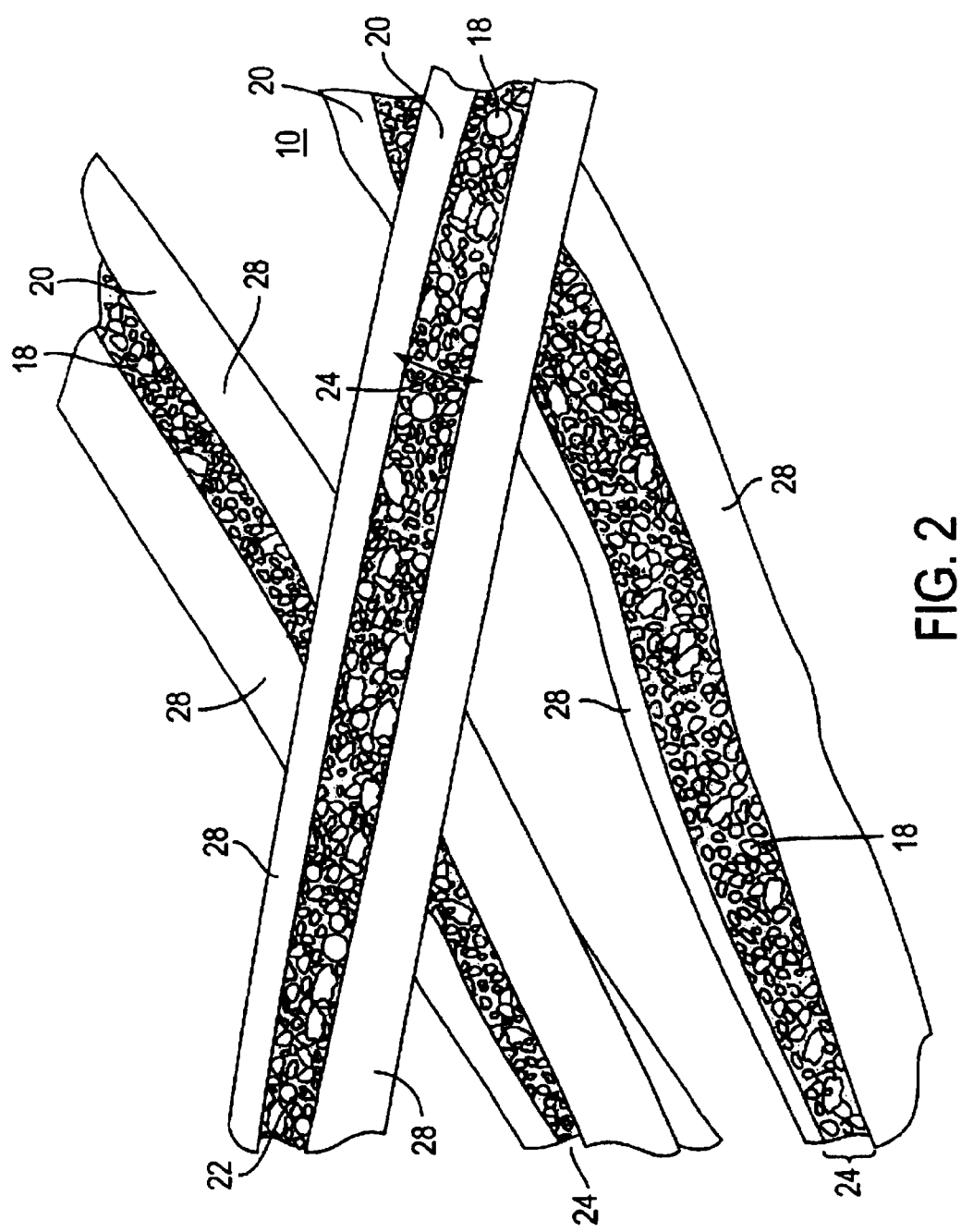
FIG. 2 shows a non-woven arrangement of a plurality of multilobal fibers having electromagnetic powder particles infused inside the cavities between adjacent T-shaped lobes.

The polymer melt is then either melt spun and extruded or granulated into pellets that are later melted again and extruded. The melted polymer blend is preferably extruded from an extruder or spinneret capable of forming a plurality of multilobal fibers 20, as seen in FIGS. 1 and 2. For example, the fibers can be formed by spinning a fiber spinning composition through a spinneret having a configuration sufficient to provide a fiber having the desired cross-section. As used herein, a "fiber spinning composition" is a melt or solution of a polymer. Such techniques are well known in the art and are described, for example, in U.S. Pat. Nos. 4,413,110 and 4,599,267. The spinneret described in U.S. Pat. No. 5,057,368 is particularly preferred for forming the fibers 20 using well known techniques. A point bonding structural stabilizing post treatment may also be conducted to stabilized the lobes of the fiber.

Figure 3:
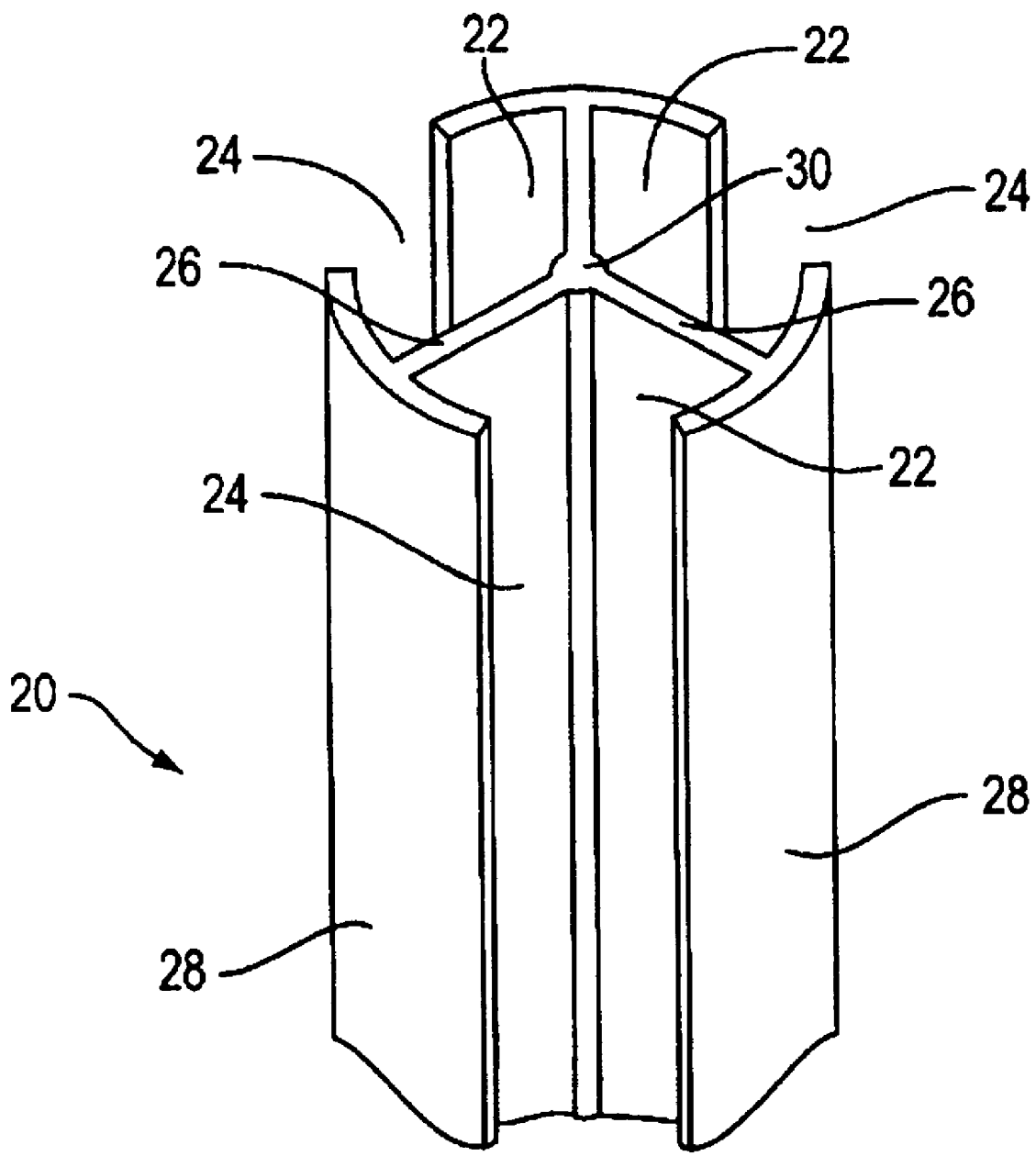
FIG. 3 shows a perspective view of a multilobal fiber having three T-shaped lobes with curved caps.
Figure 4:
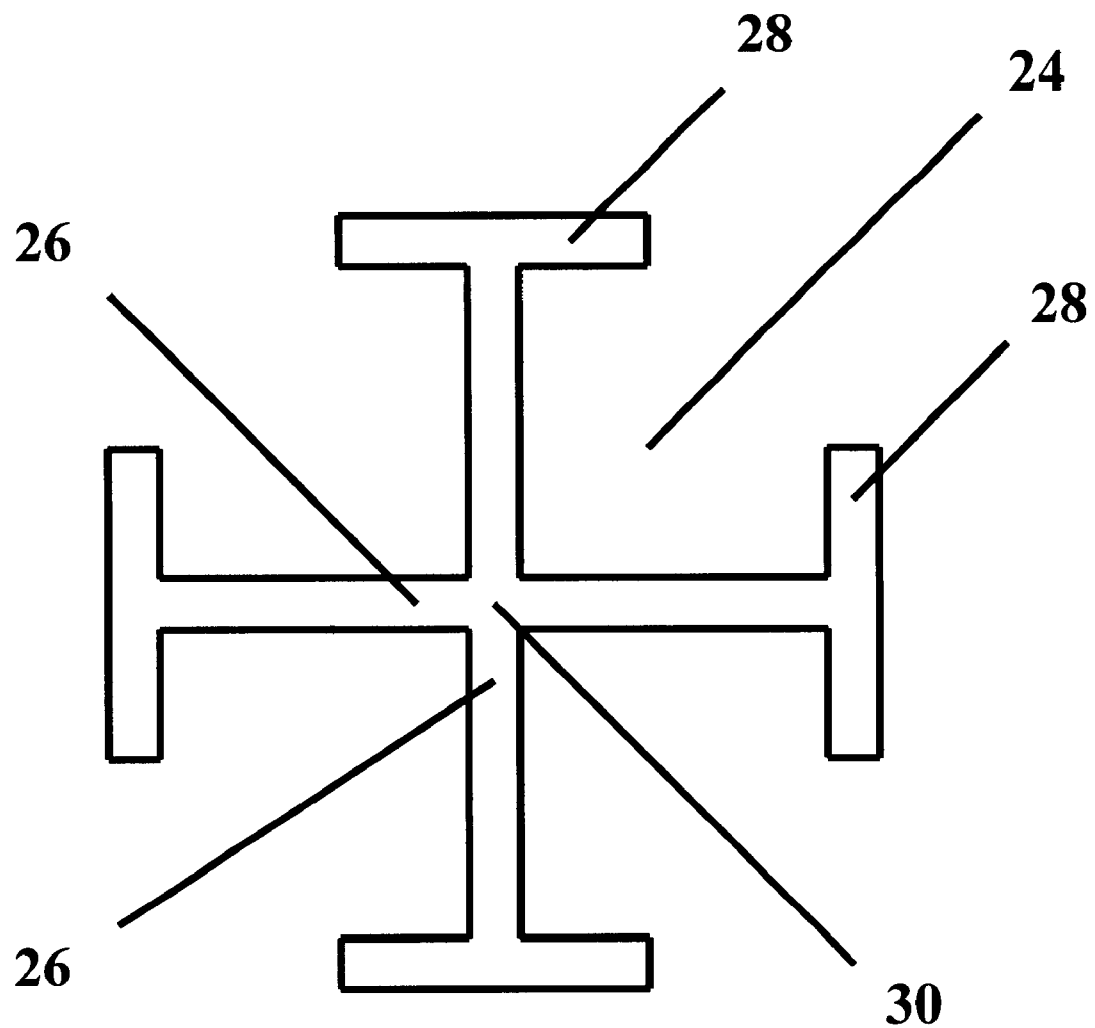
FIG. 4 shows a perspective view of a multilobal fiber having four T-shaped lobes.

The fibers of this invention may comprise trilobal or quadrilobal fibers. Shown in FIG. 3 is a trilobal fiber 20, also known as a "triad", having three T-shaped lobes projecting from a central fiber core 30. Multilobal fibers having this structure are described in U.S. Pat. Nos. 5,057,368 and 5,744,236 which are incorporated herein by reference. Shown in FIG. 4 is a quadrilobal fiber of this invention having four T-shaped lobes projecting from the core 30 of fiber 20. Fibers of this type are exemplified in U.S. Pat. No. 5,057,368 which is incorporated herein by reference. As seen in FIGS. 3 and 4, each of the T-shaped lobes comprises a leg 26 and a cap 28. These caps 28 may be curved, as seen in FIG. 3, or straight, as seen in FIG. 4. Other known multilobal fibers are hexalobal, pentalobal, tetralobal, and octalobal filament fibers, and are described in U.S. Pat. No. 5,069,970 which is incorporated herein by reference. However, these are less preferred for the purposes of this invention because they limit the amount of space available for infusion of electromagnetic shielding powder particles that are incorporated as part of the shielding material of the invention.

Between two adjacent lobes is formed a cavity 22 and extending from each cavity 22 is a long longitudinal opening 24 that extends along the entire length of the fiber 20. The angle of separation between adjacent legs 26 may vary widely and depends on the number of lobes. Preferably, the legs 26 are separated from each other by an angle of from about 80° to about 130°. In the four lobed embodiment of FIG. 4, the angle of separation of legs 26 preferably is from about 85° to about 95°. More preferably, they are separated by about 88° to 92°, and most preferably by about 90°. In the three lobed embodiment of FIG. 3, the angle of separation of legs 26 is from about 110° to about 130°, more preferably from about 115° to about 125°, and most preferably by about 120°.

The length and width of the legs 26 and caps 28 of the T-shaped lobes may vary widely. In general, the length of each leg 26 is selected such that the caps 28 of adjacent T-shaped lobes do not contact each other to form an enclosed tube like structure. Otherwise, only a minimal amount of the electromagnetic powder would make it into the cavities 22. Usually, the length of each leg 26 is from about 4.5 to about 890 $\mu$m and the width of leg 26 is from about 0.5 to about 90 $\mu$m. In the preferred embodiments of the invention, the average length of each leg 26 is from about 4.5 to about 100 $\mu$m, more preferably from about 4.5 to about 50 $\mu$m, and most preferably from about 4.5 to about 25 $\mu$m. Preferably the average width of each leg 26 is from about 0.5 to about 80 $\mu$m, more preferably from about 0.5 to about 60 $\mu$m, and most preferably from about 0.7 to about 40 $\mu$m.

The length of cap 28 is preferably from about 4.5 $\mu$m to about 1600 $\mu$m. More preferably, the length of each cap 28 is from about 4.5 $\mu$m to about 120 $\mu$m, and even more preferably from about 4.5 $\mu$m to about 75 $\mu$m. The width of each cap 28 is preferably from about 0.5 $\mu$m to about 90 $\mu$m, more preferably from about 0.5 $\mu$m to about 80 $\mu$m, and even more preferably the width is from about 0.5 $\mu$m to about 60 $\mu$m. In the most preferred embodiment of the invention, the length of each cap 28 is from about 4.5 $\mu$m to about 50 $\mu$m and the width of each cap 28 is from about 0.7 $\mu$m to about 40 $\mu$m.

The length of cap 28 of any fiber will depend on the length and width of legs 26 of each T-shaped lobe and the width of cap 28. For example, in general, the longer leg 26 of a lobe, the longer the permissible length of cap 28 becomes. Conversely, the shorter the leg 26, the shorter the permissible length of cap 28. The length of leg 26 and cap 28 of adjacent T-shaped lobes are selected such that a T-shaped lobe forms and such that caps 28 of adjacent T-shaped lobes do not intersect. The relationship between the length and width of the legs 26 and the length and width of caps 28 is more adequately described in U.S. Pat. No. 5,057,368 mentioned above.

After the fibers 20 are arranged to form the sheet 10, the fibers are impregnated with small, dry powder particles 18 of an electromagnetic shielding material. The sheet 10 may, for example, be immersed in finely divided particles and the particles rolled into the cavities 22 and openings 24 by running through a roller (preferably several times) or the fibers 20 may be liberally dusted with the powder 18 and aggressively rubbed into and between the fibers 20. The powder particles 18 of the adsorbent powder have a diameter of less the one half the fiber 20 cross sectional diameter. Preferably, the particles 18 are less than about 1 to about 3 microns across. Any excess powder may be physically removed by agitation aided by a strong air flow. Additionally, after the removal of any excess powder, an adhesive may optionally be sprayed onto the surface of the sheet 10, but this is not necessary. The powder particles 18 which remain within the cavities 22 are very stable and resistant to physical action.

The small powder particles 18 engage one another and become mechanically entrapped and remain within the fiber cavities 22 and longitudinal openings 24, and also preferably enter the space between the fibers 20. The size of the cavity 22 and opening 24 is preferably about 5 to about 20 microns, more preferably from about 10 to about 15 microns. The sizes of cavities 22 and openings 24 are selected so that once particles 18 are infused in each cavity 22 they are entrapped and cannot easily be removed. The multilobal fibers 20 are relatively small having a diameter of about 5 microns to about 250 microns, more preferably from about 10 microns to about 30 microns. For example, the fibers shown in the FIGS. 1 and 2 are approximately 30 microns in diameter. The result is an impregnated sheet 10 of woven or non-woven fibers having a powder loading of about 25% to about 99% by weight. Preferably the powder loading is greater than or equal to about 50% by weight, more preferably greater than about 75% by weight, and most preferably greater than about 90% by weight. The resulting sheet 10 after infusion of the powder particles has a preferred density of about 0.5 to 4 ounces per yard, more preferably about 1.5 to 3 ounces per yard.

Suitable electromagnetic powders non-exclusively include finely ground particles of, for example, copper, nickel, tin, zinc, chromium, boron and alloys and mixtures thereof. Also suitable are organic materials such as conducting polymers. Suitable conducting polymers include polyaniline, polythiophenes, polyacetylenes and blends thereof. These powders may be formed using well known techniques in the art. The conducting polymer may also be combined with a dopant to increase the conductivity of the powder. Conducting polymer dopants include organic and inorganic anionic dopants. Non-limiting examples of organic dopant include aryl sulfonic acids like benzene sulfonic acid. Non-limiting examples of inorganic dopants include chlorides, perchlorates and sulfates. Non-ionic dopants include iodine.

Impregnation of conducting polymers would be conducted in a similar process as described above for metallic powders or polymerized "in-situ" with the monomer and then polymerized within the channels of the fiber. A media prepared in this way would have the distinction over being able to hold significantly greater amounts of the powdered metal over other conventional fabric impregnated electromagnetic shielding materials.

The sheet 10 may also optionally be further treated with a stiffing agent to allow the sheet to retain a predetermined shape. In this case the impregnated sheet is further impregnated with a liquid thermosetting or thermoplastic agent or a solvent strippable resin such as epoxies, plastisols, PVC resins, alkyd resins or latexes. This agent is easily impregnated because of high capillary forces from the fiber cavities 22 as well as from the spaces between the powder particles. This could be done by either a fine atomizing spray or a liquid drench followed by blowing off of any excess agent. The sheet could then be shaped into a desired configuration or mold and be either heated or induced to setup according to the nature of the stiffing agent's requirements.

The material of the invention may be surface coated with virtually complete retention of the powder properties and can be extended to be used with extremely fine powders. Once the material is formed, it may then be used by as desired for forming housings or other parts for electronic devices.

The following non-limiting examples serve to illustrate the invention:

EXAMPLE 1

A non-woven fabric sheet is formed by arranging together a plurality of multilobal fibers having a triad cross-sectional configuration. The fibers are formed by melt spinning a mixture of nylon 6 and nylon 66. The density of the fabric is 1.5 ounces per yard, and the fibers have a diameter of 10 microns. This fabric is then impregnated with a finely powdered nickel which penetrates and fills open cavities and longitudinal openings within the fiber. The fine powder particles are impregnated by immersion of the fabric with the powder particles and rolling the particles into the cavities and longitudinal openings by running through a roller several times. Excess powder is then shaken off and the impregnated fabric is blown free of any extraneous powder. The result is an electromagnetic shielding, powder impregnated, non-woven fabric sheet having a powder loading of 50% by weight. The sheet may then be molded or formed into any desired shape.

EXAMPLE 2

The same process is followed as in Example 1, but the sheet is further treated with a stiffing process to allow the fabric retain a predetermined shape. The impregnated fabric is impregnated with a liquid thermosetting agent by using a fine atomizing spray followed by blowing off of any excess agent. The media is then shaped into a mold and cured.

EXAMPLE 3

A fabric is produced in a like manner as Example 1 using each of three fiber types. The first is a round cross-section fiber, the second fiber type has a Y-shaped trilobal cross-section and the third fiber type has a Y-shaped trilobal and end-capped cross-section. The three fabrics are treated and impregnated with finely powdered activated carbon to determine the levels of impregnation. The fibers are contacted with an excess of finely powdered activated carbon and rolled to secure the powder within any voids. Excess powder is removed by vigorously blowing the excess powder off the fibers. The residual held carbon loading is obtained by measuring the increase in weight gain. The round fiber fabric is observed to have a 0.8% powder uptake. The Y-shaped trilobal cross-section fabric is observed to have a 2.6% powder uptake. The Y-shaped trilobal cross-section and end-capped fabric is observed to have a 20.8% powder uptake. This shows that the triad and especially the encapped triad fiber geometry holds a substantially larger quantity of solid powders. This higher powder loading will manifest itself in far higher EM shielding capability.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A process for forming a flexible, breathable electromagnetic shielding material for forming electromagnetic shielding articles comprising:

(a) forming a molten thermoplastic polymer mixture comprising one or more polymers;

(b) melt spinning said polymer mixture to form a plurality of multilobal fibers, said fibers comprising a central core having a plurality of T-shaped lobes projecting therefrom, each of said T-shaped lobes having a leg and a cap, said lobes defining a longitudinally extending internal cavity between two adjacent legs that extends the entire length of the fiber;

(c) arranging together said plurality of multilobal fibers into a sheet, the sheet having at least one surface; and (d) applying electromagnetic shielding powder particles to at least one surface of said sheet to infuse said electromagnetic shielding powder particles between said multilobal fibers and into each cavity, said powder particles being of such a size, shape and makeup that they are securely retained within each cavity.

2. The process of claim 1 further comprising:

(e) shaping the sheet into an electromagnetic shielding article.

3. The process of claim 1 wherein the thermoplastic polymer mixture comprises one or more polyamides, polyesters, polyolefins or blends thereof.

4. The process of claim 1 wherein the thermoplastic polymer mixture comprises a blend of nylon homopolymers, a blend of nylon copolymers or a blend of nylon homopolymers and copolymers.

5. The process of claim 1 wherein said multilobal fibers comprise three T-shaped lobes projecting from the central core.

6. The process of claim 1 wherein said multilobal fibers comprise at least about four T-shaped lobes projecting from the central core.

7. The process of claim 1 comprising applying said electromagnetic shielding powder by rubbing at least one surface of the sheet with said powder and removing any excess powder from the surface.

8. The process of claim 1 comprising applying said electromagnetic shielding powder by shaking said powder onto at least one surface of the sheet and removing any excess powder from the surface.

9. The process of claim 1 further comprising applying an adhesive to at least one surface of the sheet after applying said electromagnetic shielding powder.

10. A flexible, breathable electromagnetic shielding material for forming electromagnetic shielding articles comprising:

(a) a plurality of polymeric multilobal fibers arranged together into a sheet having at least one surface, said fibers comprising a central core having a plurality of T-shaped lobes projecting therefrom, each of said T-shaped lobes having a leg and a cap, said lobes defining a longitudinally extending internal cavity between two adjacent legs that extends the entire length of the fiber; and (b) electromagnetic shielding powder particles infused between said arranged fibers and in said cavities, said powder particles being of such a size, shape and makeup that they are securely retained within each cavity.

11. The material of claim 10 wherein the sheet is woven.

12. The material of claim 10 wherein the sheet is non-woven.

13. The material of claim 10 wherein said fibers comprise one or more polyamides, polyesters, polyolefins or blends thereof.

14. The material of claim 10 wherein said fibers comprise a blend of nylon homopolymers, a blend of nylon copolymers or a blend of nylon homopolymers and copolymers.

15. The material of claim 10 wherein said fibers comprise three T-shaped lobes projecting from the central core.

16. The material of claim 10 wherein said fibers comprise at least four T-shaped lobes projecting from the central core.

17. The material of claim 10 wherein adjacent lobes are separated by an angle between adjacent legs of about 80° to about 130°.

18. The material of claim 10 wherein the length of said legs is from about 4.5 $\mu$m to about 890 $\mu$m.

19. The material of claim 10 wherein the width of said legs is from about 0.5 $\mu$m to about 90 $\mu$m.

20. The material of claim 10 wherein the length of said caps is from about 4.5 $\mu$m to bout 1600 $\mu$m.

21. The material of claim 10 wherein the width of said caps is from about 0.5 $\mu$m to about 90 $\mu$m.

22. The material of claim 10 wherein the electromagnetic shielding powder comprises one or more materials selected from the group consisting of nickel, copper, zinc, tin, chromium, boron, combinations of these metals, and conducting polymers with or without dopants.

23. The material of claim 10 wherein the electromagnetic shielding powder comprises polyaniline, polythiophene, polyacetylene or combinations thereof.

24. A shaped electromagnetic shielding article formed from the material of claim 10.

25. The material of claim 10 wherein the electromagnetic shielding powder particles are treated with a stiffening agent.

26. The material of claim 25 wherein the stiffening agent comprises and epoxy, a plastisols, polyvinyl chloride, an alkyd resin, a latex, or combinations thereof.

27. The material of claim 25 herein the electromagnetic shielding powder is combined with a dopant.

28. The material of claim 27 wherein the dopant comprises an aryl sulfonic acid, a chloride, a perchlorate, a sulfates, iodine and combinations thereof.

* * * * *